(12) United States Patent
Valentine et al.

(10) Patent No.: US 11,563,146 B1
(45) Date of Patent: Jan. 24, 2023

(54) SHALLOW ETCHING OF MICROLEDS FOR INCREASED LIGHT EXTRACTION

(71) Applicant: META PLATFORMS TECHNOLOGIES, LLC, Menlo Park, CA (US)

(72) Inventors: Gareth John Valentine, Redmond, WA (US); James Ronald Bonar, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 100 days.

(21) Appl. No.: 17/133,421

(22) Filed: Dec. 23, 2020

Related U.S. Application Data

(62) Division of application No. 15/892,790, filed on Feb. 9, 2018, now Pat. No. 10,910,517.

(51) Int. Cl.
| | |
|---|---|
| *H01L 33/10* | (2010.01) |
| *H01L 33/00* | (2010.01) |
| *H01L 33/06* | (2010.01) |
| *H01L 33/32* | (2010.01) |
| *H01L 33/46* | (2010.01) |

(52) U.S. Cl.
CPC ......... *H01L 33/10* (2013.01); *H01L 33/0075* (2013.01); *H01L 33/06* (2013.01); *H01L 33/32* (2013.01); *H01L 33/46* (2013.01); *H01L 2933/0058* (2013.01)

(58) Field of Classification Search
CPC ..... H01L 33/10; H01L 33/0075; H01L 33/06; H01L 33/32; H01L 33/46; H01L 2933/0058
See application file for complete search history.

(56) References Cited

U.S. PATENT DOCUMENTS

| | | | |
|---|---|---|---|
| 9,559,250 B2 | 1/2017 | Bonar et al. | |
| 2011/0235666 A1 | 9/2011 | Sonobe et al. | |
| 2013/0207150 A1* | 8/2013 | Inoue | H01L 33/60 438/27 |
| 2017/0170360 A1* | 6/2017 | Bour | H01L 33/145 |
| 2018/0182939 A1 | 6/2018 | Liu et al. | |

* cited by examiner

*Primary Examiner* — Benjamin Tzu-Hung Liu
(74) *Attorney, Agent, or Firm* — Fenwick & West LLP (57) ABSTRACT

Embodiments of the present disclosure generally relate to light emitting diodes LEDs and methods of manufacturing the LEDs. The LEDs include a mesa-structure that improves light extraction of the LEDs. Furthermore, the process for forming the LEDs refrains from using physical etching to a quantum well active region of the LEDs to prevent compromising performance at the quantum well sidewall.

7 Claims, 7 Drawing Sheets

SHALLOW ETCHING OF MICROLEDS FOR INCREASED LIGHT EXTRACTION

CROSS REFERENCE TO RELATED APPLICATIONS

This application is a division of co-pending U.S. application Ser. No. 15/892,790, filed Feb. 9, 2018, which is incorporated by reference in its entirety.

BACKGROUND

The present disclosure relates to micro-LEDs (μLEDs). More specifically, the present disclosure relates to a μLED structure that increases light extraction from the μLED and a method of forming the μLED structure.

BACKGROUND

LEDs convert electrical energy into optical energy. In semiconductor LEDs, light is usually generated through recombination of electrons, originating from an n-type doped semiconductor layer, and holes originating from a p-type doped semiconductor layer. Generally, the area where the main light generation takes place is termed the light-emitting layer.

A major challenge is to extract as much of the emitted light as possible from the semiconductor material into the surrounding medium, typically air, thereby increasing the extraction efficiency. Extraction efficiency describes the amount of light extracted from an LED device as a proportion of the total light generated by the device. Typically, extraction efficiency is hindered by total internal reflection at the surfaces of the semiconductor.

SUMMARY

A μLED structure includes a mesa-structure to improve light extraction of the μLED. The mesa-structure includes a sloped sidewall that reflects light towards a light emitting surface of the μLED structure. Furthermore, a method of manufacturing the μLEDs is disclosed. The method does not incorporate physical etching of a quantum well active region of the μLEDs. By refraining from physically etching the μLEDs, quantum well active region performance is not compromised by inducing unwanted surface defects.

BRIEF DESCRIPTION OF THE DRAWINGS

Figure (FIG. 1A is cross-section of a μLED device according to one embodiment.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the present disclosure generally relate to μLEDs with increased light extraction by using a mesa-structure. More specifically, the μLEDs are manufactured by a process that does not physically etch a quantum well active region of the μLEDs. By refraining from physically etching the quantum well, quantum well active region performance is not compromised by inducing unwanted surface defects at the quantum well active region sidewall. This effect becomes more pronounced as the ratio of the perimeter of the μLED to the surface area of the active area increases i.e. as the μLED reduce in size.

The term "μLED" describes an LED that is smaller than a standard cuboid LED in one embodiment. A μLED may have an active region of approximately less than 80 μm diameter.

μLED Structure

Figure 1A:
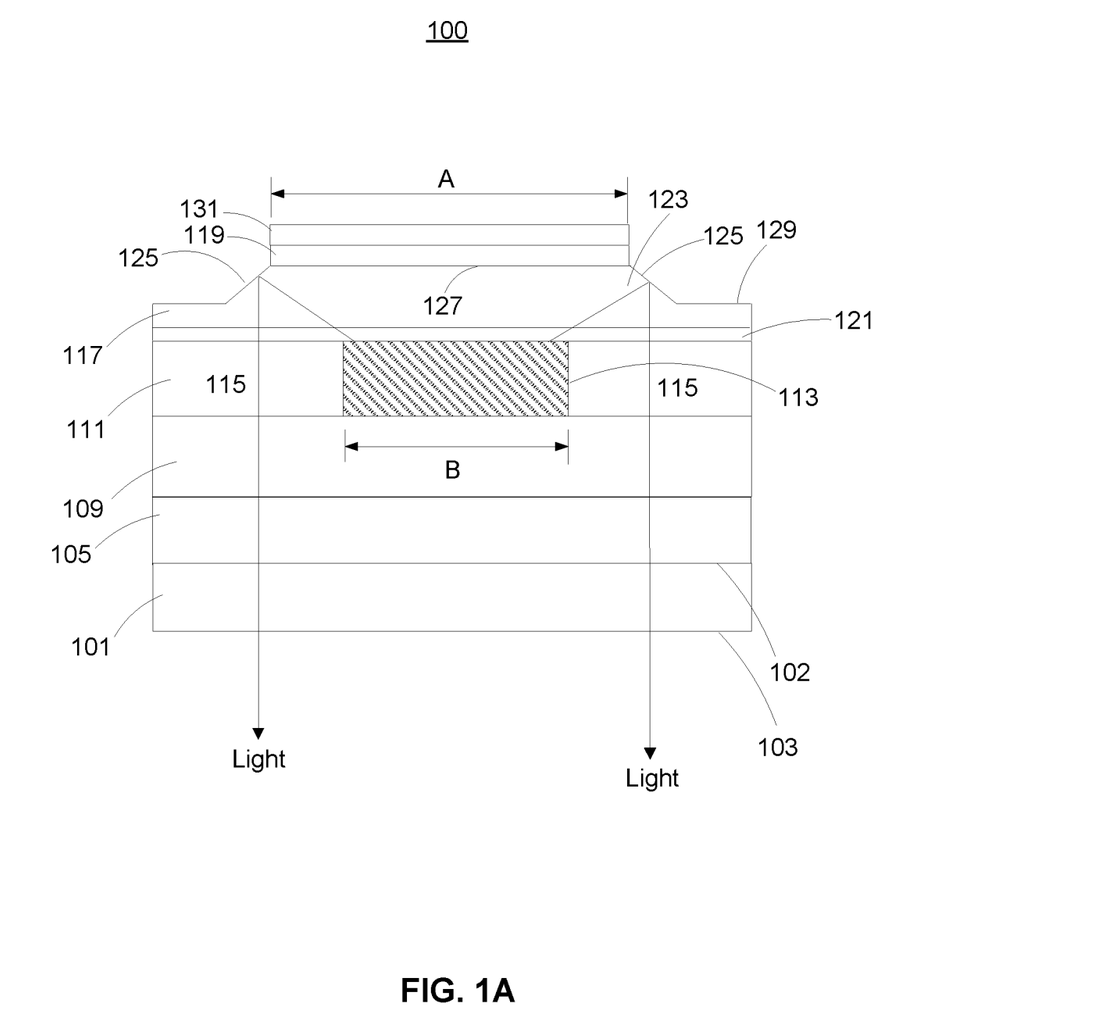

FIG. 1A illustrates a cross-section of a μLED 100 according to one embodiment. As shown in FIG. 1A, the μLED 100 includes a substrate 101. The substrate 101 is made of sapphire in one embodiment. However, in other embodiments the substrate 101 may be made of other materials such as silicon, silicon carbide, or free standing GaN. In some embodiments, the substrate 101 may be removed after forming and shaping other layers of the μLED 100.

The substrate 101 includes a first surface 102 (e.g., an upper surface) and a second surface 103 (e.g., a bottom surface) that is at the opposite side of the first surface 102. The second surface 103 is a light emitting surface of the μLED 100 in one embodiment. That is, light generated by the μLED 100 exits from the second surface 103 of the substrate 101.

The μLED 100 may also include a buffer layer and undoped GaN 105 on the substrate 101. A doped GaN layer 109 (e.g., n-GaN) on the buffer and undoped GaN layer 105 according to one embodiment. In other embodiments, the μLED 100 may include other layers than those discussed herein.

A quantum well (QW) layer 111 or otherwise referred to as a quantum well region is on the n-type GaN layer 109. The QW layer 111 includes one or more quantum well structures that comprise a confined active region 113 and one or more non-active regions 115. The confined active region 113 of the μLED 100 emits light through the light emitting surface of the substrate 101 responsive to an application of an electrical current to the confined active region 113. The non-active regions 115 do not emit light as the current is channeled into the region denoted 113.

A semiconductor layer 117 is on the QW layer 111. In one embodiment, the semiconductor layer 117 is made of p-type GaN (e.g., p-GaN). The semiconductor layer may also comprise of both a p-GaN layer 117 and a capping layer 119 that is grown over the p-GaN layer 117. The capping layer 119 may be made of highly doped p++ GaN, indium tin oxide (ITO), or other transparent conductors. Furthermore, an electron blocking layer (EBL) 121 such as aluminum gallium nitride (AlGaN) could be grown between the QW layer 111 and p-GaN layer 117 to improve the performance of the confined active region 113. A further embodiment involves the incorporation of n-type GaN tunnel junction to replace the metal contact to reduce the resistance and to improve the optical qualities of the microLED. Current is channeled into the confined active region 113 due to the n-behaving nature of the p-GaN layer after a plasma induced modification is performed on regions of the semiconductor layer 117, as described, for example, in U.S. Pat. No. 9,559,250 issued on Jan. 31, 2017, which is incorporated by reference. The semiconductor layer 117 can have a thickness in the range of 50 nm to 200 nm in one embodiment but can be other thicknesses in different embodiments.

In one embodiment, the μLED 100 includes a reflective layer 131. As shown in FIG. 1A, the reflective layer 131 may be formed on the capping layer 119. However, in embodiments without the capping layer 119, the reflective layer 131 may be formed on the semiconductor layer 117. The reflective layer 131 may be made of aluminum, silver, or any other metal with reflective properties. The reflective layer 131 reflects light generated by the μLED 100 towards the light emitting surface 115 of the μLED 100. In one embodiment, the reflective layer 131 also functions as an electrode.

Figure 1B:
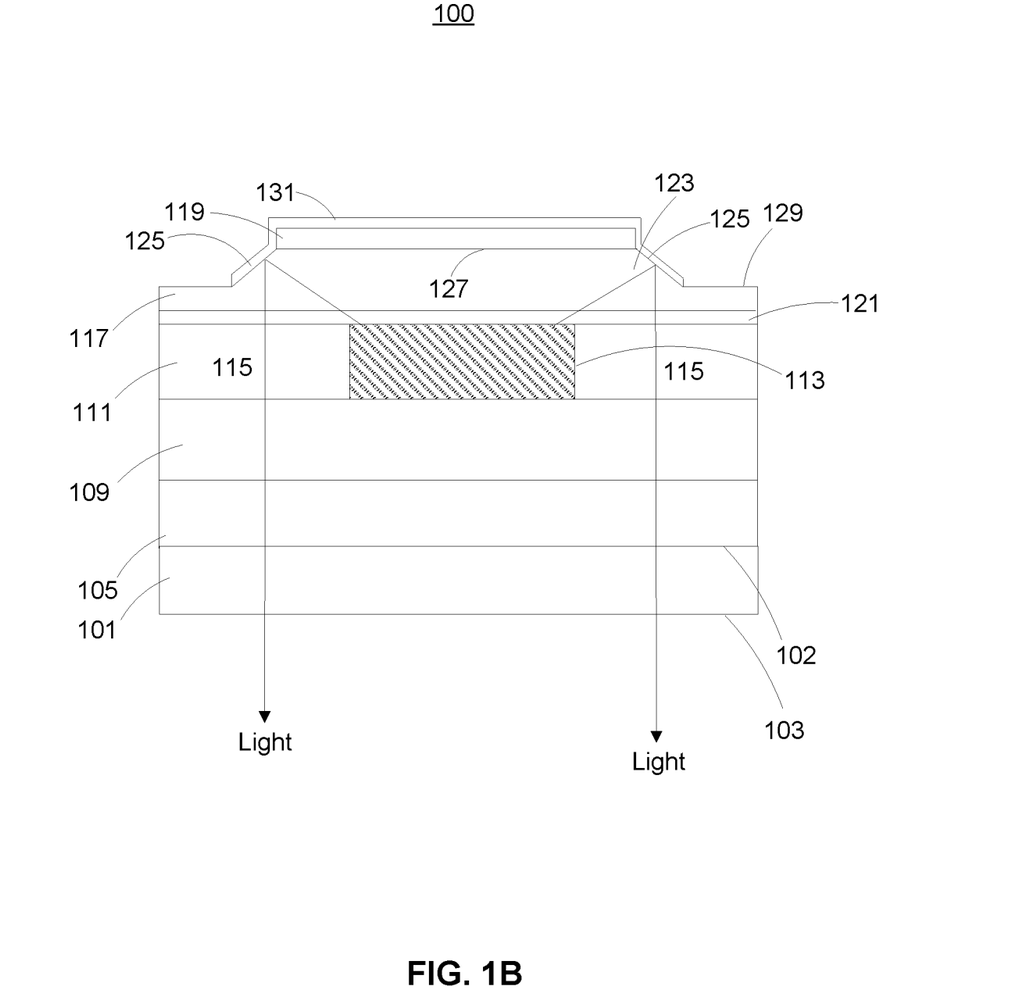
FIG. 1B is cross-section of the μLED device according to another embodiment.

As shown in FIG. 1A, the semiconductor layer 117 has a mesa-shape. That is, the semiconductor layer 117 includes a portion 123 that protrudes in a direction away from the light emitting surface (e.g., second surface 103) of the μLED 100. As shown in FIG. 1, the protruding portion 123 of the semiconductor layer 117 has sloped sidewalls 125. In one embodiment, the sloped sidewalls 125 may be at an angle of 45 degrees to vertical. Alternatively, the angle may be set to an optimum angle specific to the μLED 100's dimensions to optimize light extraction and minimize beam divergence. The sloped sidewalls 125 are each formed between horizontal surfaces of the semiconductor layer 117 (e.g., the top flat surface 127 of the protruding portion 123 and the lower flat surface 129 of the semiconductor layer 117). In one embodiment, the sloped sidewalls 125 reflect light that is incident upon the protruding portion 123 of the semiconductor layer 117 with angles greater than a threshold angle that is defined by the critical angle of the semiconductor material. For example, the critical angle for GaN is 24 degrees. The arrows in FIG. 1A illustrate how light emitted from the confined active region 113 is reflected off the sloped sidewall 125 of the protruding portion 123 of the semiconductor layer 117 toward the light emitting surface of the substrate 101 with a reduced angle of incidence such that a greater portion of light rays are below the critical angle at which total internal reflection occurs at the interface of the substrate 101. As a result, light extraction efficiency of the μLED 100 is improved compared to conventional planar μLEDs. In another embodiment, the reflective layer 131 extends over the sloped sidewalls 125 such that reflection of light at all angles may occur at the reflective layer 131 as shown in FIG. 1B. In another embodiment, the capping layer 119 and the reflective layer 131 both extend over the sloped sidewalls 125 as shown in FIG. 1E.

Typically, the light emitting area of a convention μLED is based on the size of the active region. However, the light emitting area of the μLED 100 appears larger than the size of the confined active region 113 because of the increased light emission due to light that reflects off of the sloped sidewalls 125 of the protruding portion 123 of the semiconductor layer 117. As shown in FIG. 1A, the diameter A of the protruding portion 123 of the semiconductor layer 117 is larger than the diameter B of the confined active region 105.

In one embodiment, diameter A is two times the diameter of the active region (e.g., diameter A=2*diameter B). In other embodiments, diameter A of the protruding portion 123 of the semiconductor layer 109 is the same size as diameter B of the confined active region 113, but light extraction efficiency is reduced compared to embodiments where the diameter A of the protruding portion 123 of the semiconductor layer 117 is larger than diameter B of the confined active region 113. Thus, diameter A of the protruding portion 123 of the semiconductor layer 117 can be within a range of one time the diameter of the confined active region 113 to two times the diameter of the confined active region 113.

Figure 1C:
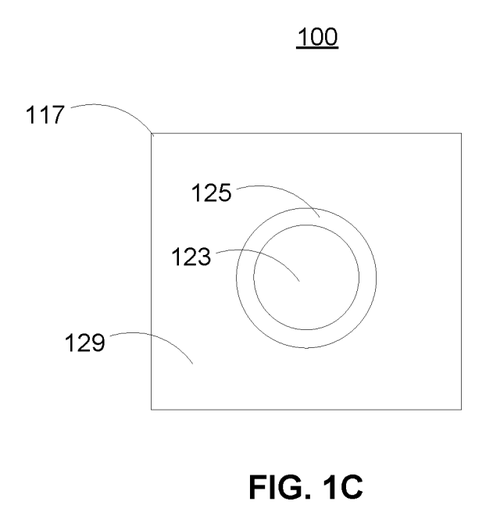
FIG. 1C is a plan view of the μLED device according to one embodiment.
Figure 1D:
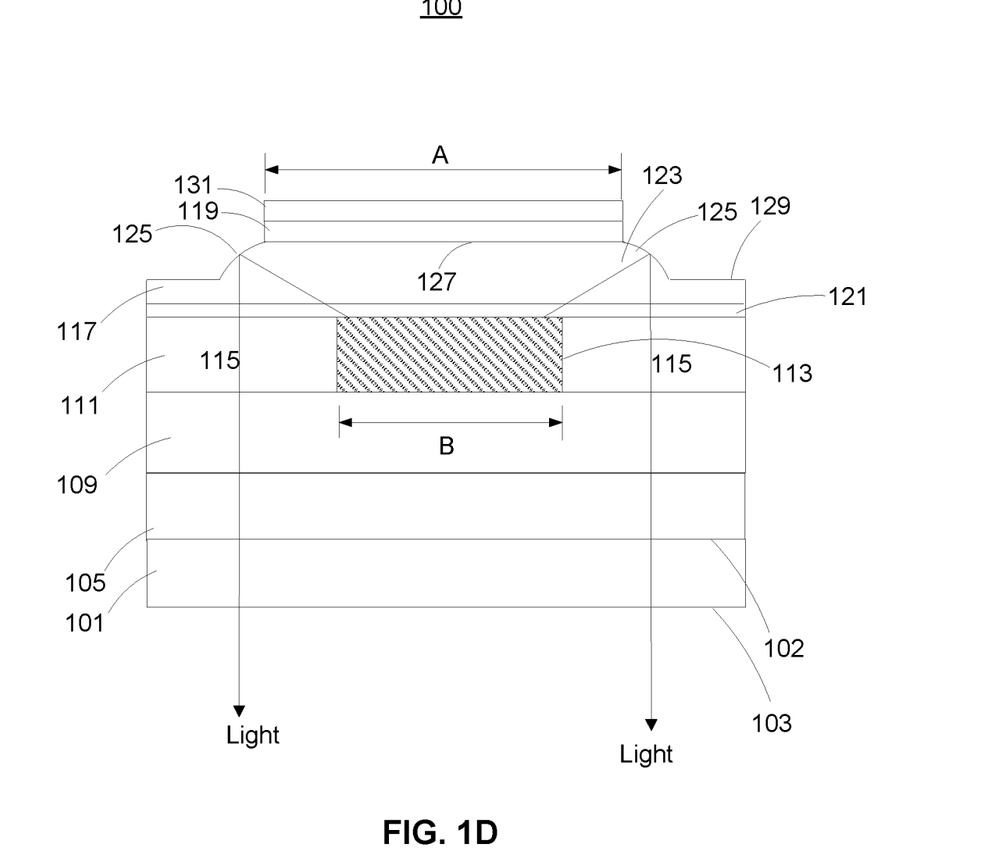
FIG. 1D is cross-section of the μLED device according to yet another embodiment.
Figure 1E:
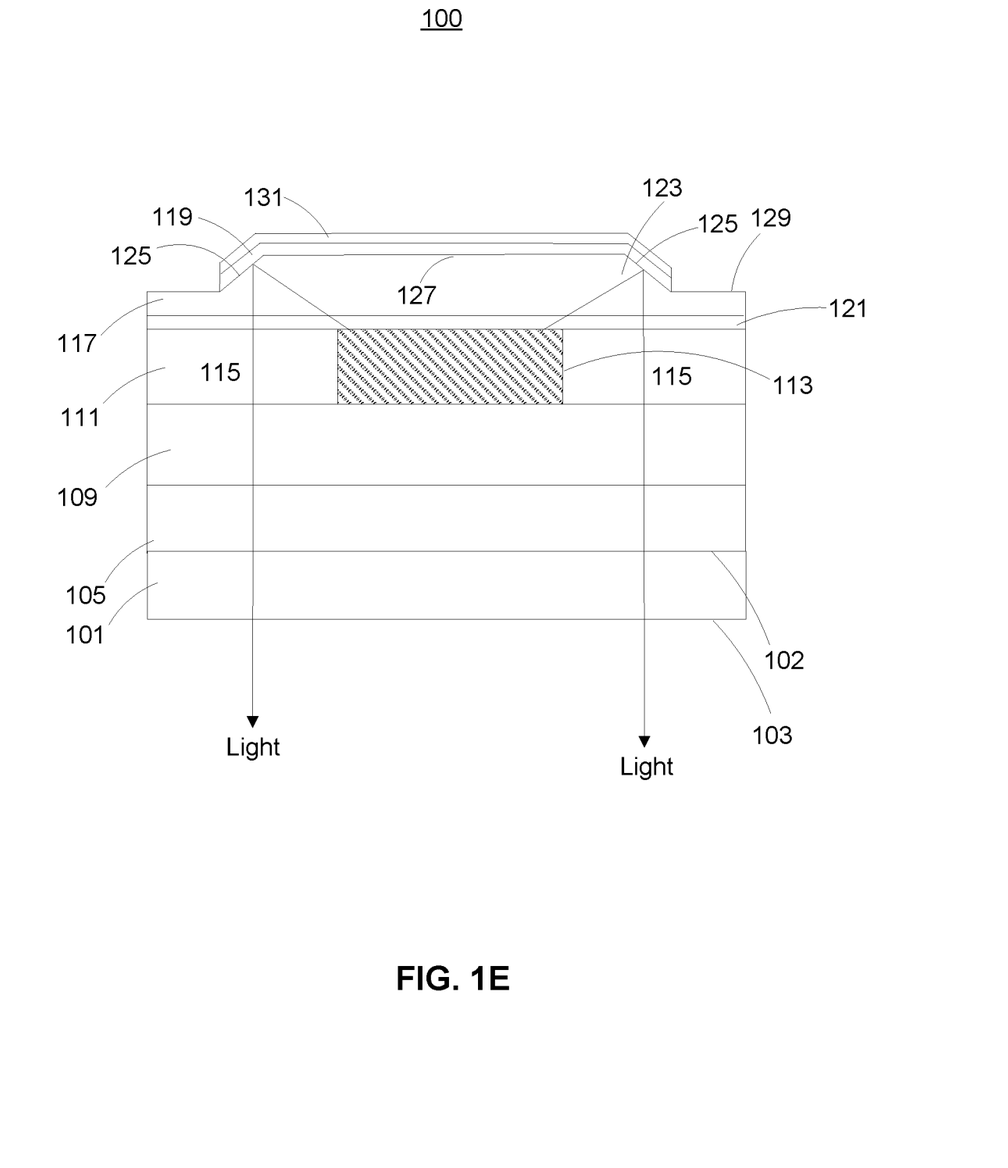
FIG. 1E is cross-section of the μLED device according to yet another embodiment.

FIG. 1C is a plan view of the μLED 100 according to one embodiment. As shown in FIG. 1B, the protruding portion 123 of the semiconductor layer 117 is circular in shape according to one embodiment. In other embodiments, the protruding portion 123 can have other shapes such as a pyramidal shape or hexagonal in shape. In one embodiment, the protruding portion 123 of the semiconductor layer 117 overlaps the entire confined active region 113 of the QW layer 111 and a portion of the non-active region 115 of the QW layer 111 as described above. Alternatively, the protruding portion 123 of the semiconductor layer 117 overlaps the entire confined active region 113 without overlapping the non-active region 115 of the QW layer 111. The sloped sidewall 125 of the protruding portion 123 of the semiconductor layer 117 surrounds at least the confined active region 113 of the QW layer 111 in the plan view.

Figure 2:
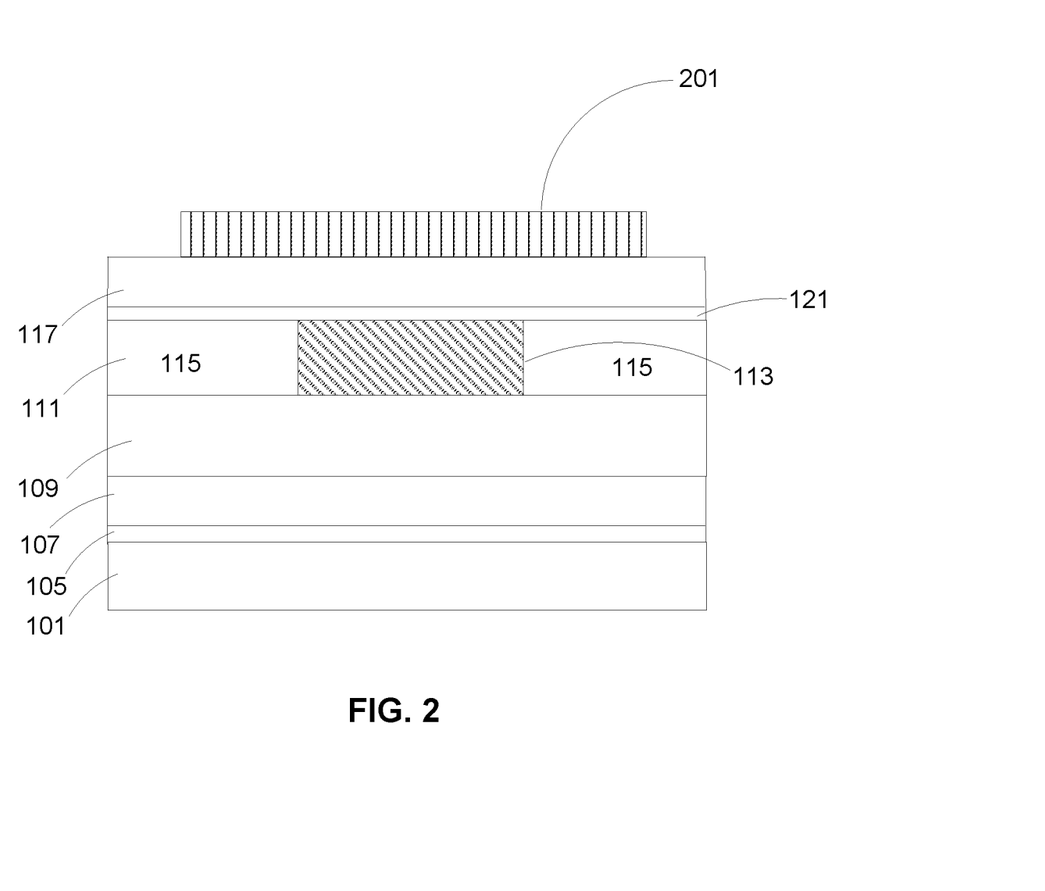
FIG. 2 is a cross section of the μLED illustrating how to form sloped sidewalls in the semiconductor layer of the μLED according to one embodiment.

FIG. 2 is a cross section of the μLED 100 illustrating how to form the sloped sidewalls 125 of the semiconductor layer 117 according to one embodiment. In one embodiment, the substrate 101, buffer layer 105, n-type GaN layer 109, QW layer 111 including the confined active region 113 and non-active region 115, and the EBL layer 121 are formed via conventional manufacturing processes. The semiconductor layer 117 is formed on the EBL layer 121.

To form the sloped sidewall 125 of the semiconductor layer 117, a mask layer 201 is first deposited on a metal contact layer (not shown) deposited on the semiconductor layer 117. The mask layer 201 could be dielectric, polymeric or metallic. The mask layer 201 functions as a mask to protect the portions of the μLED 100 that are overlapped by the mask layer 201 during an etching process. For example, the mask layer 201 completely overlaps the confined active region 113 of the quantum well 111. The mask layer 201 may also overlap a portion of the non-active regions 115 of the quantum well 111. In one embodiment, the mask layer 201 has a diameter that is at least the same size as the diameter of the confined active region 113. As shown in FIG. 2, the mask layer 201 covers a majority of the semiconductor layer 117 while leaving portions of the semiconductor layer 117 exposed.

In one embodiment, a shallow physical etch such as anisotropic etching is performed on the exposed portions of the semiconductor layer 117. The exposed portions of the semiconductor layer 117 are removed via the shallow physical etch to form the sloped sidewalls 125 shown in FIG. 1. The shallow physical etch etches a portion of the semiconductor layer 117 that is less than the thickness of the semiconductor layer 117 thereby resulting in the formation of the sloped sidewalls 125. As mentioned above, the semiconductor layer 117 may have a thickness of 150 nm. The shallow physical etch removes approximately 100 nm of the semiconductor layer 117 according to one embodiment. Since the confined active region 113 does not have any etched surfaces due to being blocked by the mask layer 201 during the etching process, defects in the confined active region 113 resulting in non-radiative recombination is minimized. After the sloped sidewalls 125 are formed, the mask layer 201 is removed.

In another embodiment, the sloped sidewalls may have a non-linear profile such as parabolic or spherical as shown in FIG. 1C. Such profiles may be formed by heating and hence reflowing a photoresist mask prior to etching.

Method for Forming the µLED Structure

Figure 3:
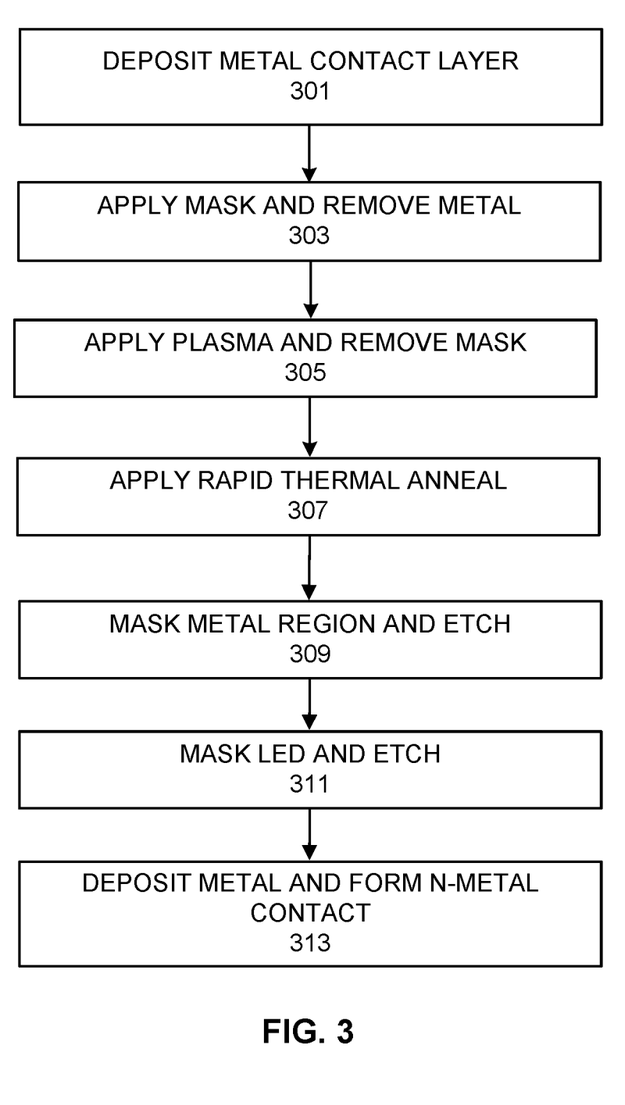
FIG. 3 is a flowchart describing a process for forming the μLED according to one embodiment.

FIG. 3 is a flowchart describing a process for forming the µLED 100 according to one embodiment. In the embodiment shown in FIG. 3, the process assumes that the semiconductor layer 117 and layers below the semiconductor layer 117 have already been formed. In other embodiments, steps other than those shown in FIG. 3 may be performed to form the µLED 100.

In one embodiment, a metal contact layer is deposited 301 on the semiconductor layer 117. A mask is applied 303 to the metal contact layer and metal that is adjacent to the emitter of the µLED 100 is removed. The exposed surfaces are treated with plasma and the mask is removed 305. The mask overlaps the active region 113 in the quantum well 111 to block the active region 113 from plasma that is applied to the semiconductor layer 117. The applied plasma converts the exposed portions of the semiconductor layer 117 from conductive p-GaN to a less conductive or non-conductive species which may in some situations behave as n-GaN. A rapid thermal anneal process may also be applied 307 to both provide a good metal contact and simultaneously enhance the conversion process of the exposed p-GaN to a non-conductive form. Current is channeled into the confined active region 113 due to the n-behaving nature of the modified p-GaN layer that is used as the semiconductor layer 117 surrounding this confined region.

A mask layer is then applied 309 on the metal region. The mask layer overlaps the confined active region 113 of the quantum well layer 111. The semiconductor layer 117 is etched 309 to form the sloped sidewalls 125 of the semiconductor layer 117. Since the confined active region 113 is not etched, quantum well active region performance is not compromised.

Another mask is applied 311 to the µLED 100 and a portion of the quantum well next to the emitter or array of emitters is etched to expose the n-region. Metal is then deposited 313 to form the n-metal contact.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein.

What is claimed is:

1. A method for fabricating a light emitting diode (LED) device comprising:
    forming a quantum well region comprising one or more quantum well structures that includes an active portion and a plurality of non-active portions, the active portion generating light that is emitted through a light emitting surface of the LED responsive to an application of an electrical current to the active portion, and the plurality of non-active portions not generating light;
    forming a semiconductor layer on the quantum well region;
    shaping the formed semiconductor layer to include a sloped sidewall that protrudes from the semiconductor layer in a direction away from the light emitting surface, ends of the sloped sidewall connecting a first flat surface of the semiconductor layer to a second flat surface of the semiconductor layer located further away from the light emitting surface than the first flat surface; and
    forming an electrode disposed on the second flat surface of the semiconductor layer but not on the sloped sidewall,
    wherein a width of the second flat surface of the semiconductor layer and a width of the electrode are formed to be wider than a width of the active portion of the quantum well.

2. The method of claim 1, wherein shaping the formed semiconductor layer comprises shaping the formed semiconductor layer such that a first end of the sloped sidewall is connected to the first flat surface of the semiconductor layer, and a second end of the sloped sidewall is connected to the second flat surface of the semiconductor layer that is above the first flat surface.

3. The method of claim 2, wherein shaping the formed semiconductor layer comprises:
    depositing a mask layer on the formed semiconductor layer, the mask layer overlapping the active portion of the quantum well and overlapping a portion of the formed semiconductor layer that overlaps the active portion of the quantum well region; and
    etching one or more portions of the formed semiconductor layer that are not overlapped by the mask layer to create the sloped sidewall without etching the active portion of the quantum well region.

4. The method of claim 1, wherein the sloped sidewall and the first flat surface of the semiconductor layer are formed above the quantum well region.

5. The method of claim 1, wherein the formed semiconductor layer further comprises a third flat surface that is under the first flat surface, the second flat surface, and the sloped sidewall, the third flat surface overlapping the first flat surface, the second flat surface, and the sloped sidewall.

6. A method for fabricating a light emitting diode (LED) device comprising:
    forming a quantum well region comprising one or more quantum well structures that includes an active portion and a plurality of non-active portions, the active portion generating light that is emitted through a light emitting surface of the LED responsive to an application of an electrical current to the active portion, and the plurality of non-active portions not generating light;
    forming a semiconductor layer on the quantum well region; and
    shaping the formed semiconductor layer to include a sloped sidewall that protrudes from the semiconductor layer in a direction away from the light emitting surface, ends of the sloped sidewall connecting a first flat surface of the semiconductor layer to a second flat surface of the semiconductor layer located further away from the light emitting surface than the first flat surface,
    wherein the second flat surface of the semiconductor layer is shaped to have a diameter that is larger than a diameter of the active portion of the quantum well region.

7. The method of claim 6, wherein the diameter of the second flat surface of the semiconductor layer is in a range of one times the diameter of the active portion of the quantum well to twice the diameter of the active portion of the quantum well region.

* * * * *